United States Patent
Van Lieverloo

(10) Patent No.: US 6,229,182 B1
(45) Date of Patent: May 8, 2001

(54) SEMICONDUCTOR DEVICE HAVING PROTECTION AGAINST ELECTROSTATIC DISCHARGE

(75) Inventor: Henricus A. L. Van Lieverloo, Nijmegen (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/326,894

(22) Filed: Jun. 7, 1999

(30) Foreign Application Priority Data

Jun. 9, 1998 (EP) .................................................. 98201921

(51) Int. Cl.[7] .................................................. H01L 23/62
(52) U.S. Cl. ........................... 257/355; 257/357; 257/360
(58) Field of Search .................................... 257/355, 360, 257/356, 357, 363

(56) References Cited

U.S. PATENT DOCUMENTS

| | | | |
|---|---|---|---|
| 4,990,976 | * | 2/1991 | Hattori .................................. 357/23.4 |
| 5,430,595 | * | 7/1995 | Wagner et al. ........................ 361/56 |
| 5,440,162 | * | 8/1995 | Worley et al. ........................ 257/355 |
| 5,493,142 | | 2/1996 | Randazzo et al. .................... 257/328 |
| 5,623,156 | * | 4/1997 | Watt ..................................... 257/355 |
| 5,844,280 | * | 12/1998 | Kim ..................................... 257/355 |

* cited by examiner

Primary Examiner—Matthew Smith
Assistant Examiner—Lex H. Malsawma
(74) Attorney, Agent, or Firm—Steven R. Biren

(57) ABSTRACT

To improve the robustness of a protection against ESD, a transistor structure is proposed in which breakdown does not occur at the surface of the silicon body but in the bulk of the silicon at a distance from the surface. To this end, the drain of the transistor is partly provided in a well, on a side remote from the channel, which well is of the same conductivity type as the silicon body but has a higher doping level than said body. Due to the higher doping level, breakdown will occur in the bulk at the bend of the pn-junction. In an important embodiment, the transistor forms an output transistor of the circuit. Since a transistor is not necessary to ensure a uniform current distribution, a compact structure and possibly a lower ground bounce may be achieved.

15 Claims, 3 Drawing Sheets

SEMICONDUCTOR DEVICE HAVING PROTECTION AGAINST ELECTROSTATIC DISCHARGE

BACKGROUND OF THE INVENTION

The invention relates to a semiconductor device comprising a semiconductor body including an integrated circuit provided with bonding pads for connecting the circuit to external supply conductors and with means for protecting the circuit against damage caused by electrostatic discharge, said means comprising at least a protection diode which is connected to a bonding pad and formed by a drain region of a field effect transistor with an insulated gate electrode, which field effect transistor includes a source region and a drain region, which are separated from each other by an intermediate channel region, said source and drain regions being formed by surface areas of a first conductivity type in a surface area of the second, opposite, conductivity type.

Such a device is disclosed, for example, in U.S. Pat. No. 5,493,142.

The use of a field effect transistor as a protection against ESD is generally known. In a much used configuration, often referred to as ggNMOST (grounded gate NMOST), the gate or gate electrode is connected, with its source region, to the bonding pad which is connected to earth or $V_{ss}$, while the drain is connected to an I/O pad. If, for example as a result of contact of the pad with a human body, there is a risk that the voltage on the bonding pad will increase to a very high value which may seriously damage or even destruct the circuit, the protection diode will break down before the damage has occurred, thus enabling the electric charge to be removed. The operation of the protection diode is enhanced by the "snap-back" effect, whereby the lateral bipolar transistor, formed by the drain region as the collector and the source region and the surface region as, respectively, the emitter and the base, becomes operative.

To ensure a proper operation of the circuit, it is very important that the properties of the protection element, during operation, are not or hardly subject to change as a result of breakdown. An important parameter in this respect is the leakage current of the diode, because too large a leakage current of the protection diode adversely affects the quality of the entire circuit. In practice it has been found that this leakage current can increase considerably. The robustness of the protection element can be increased by providing a resistance in series with the drain, as proposed in the above-mentioned patent U.S. Pat. No. 5,493,142. The resistance provides for a uniform current distribution over the surface of the diode, so that the formation of generation centers as a result of local current concentration can be precluded. A drawback of such a resistance is, inter alia, that during normal operation the current passing through the transistor also runs through the resistance. In order to keep the overall resistance at a sufficiently low level, it is often necessary to reduce the transistor resistance by increasing the transistor, which requires additional space.

SUMMARY OF THE INVENTION

It is an object of the invention to provide, inter alia, an integrated circuit which comprises a robust and compact ESD-protection. To achieve this, a semiconductor device in accordance with the invention is characterized in that the surface area is provided with a well of the same conductivity type as the surface area of the second conductivity type and a higher doping than the surface area, which well extends from the surface to a greater depth in the semiconductor body than the drain region and, viewed on the surface, is situated at a distance from the channel region and extends only below a part of the drain region, said drain region being situated, on the side facing away from the channel region, in the well and, on the side bordering on the channel region, in the surface area with a lower doping.

The invention is based, inter alia, on the realization that in known ESD-protections, electric breakdown generally occurs at the surface, where it gives rise to degradation of the surface and generation of additional surface conditions. In the device in accordance with the invention, breakdown takes place in the bulk of the semiconductor body, at a distance from the surface, near the curvature of the pn-junction between the drain region and the well as a result of the doping in the well. As a result of the bulk-breakdown, the ESD-protection is much more stable than in known devices and, also after breakdown, the leakage current remains at a low level.

A preferred embodiment in which the above-described "snap-back" effect may be used very effectively is characterized in that the well is of the second conductivity type and provided with a surface area of the first conductivity type which is situated at a distance from the drain region of the first conductivity type and which forms the emitter of a lateral bipolar transistor whose base region and collector region are formed, respectively, by the well of the second conductivity type and the drain region of the first conductivity type. When breakdown has occurred at the drain region, this transistor may become conducting and hence remove a substantial part of the electric charge. In this connection, a favorable embodiment is characterized in that the well is provided with a heavily doped contact region of the second conductivity type which is conductively connected to the emitter zone of the first conductivity type, said emitter zone, viewed on the surface, being situated between the collector region and the contact region of the well.

By virtue of the robustness of the above-described ESD-protection, an additional resistance in the current path of the drain region is no longer necessary. A further preferred embodiment offering special advantages, in particular if the transistor forms an output transistor of the circuit, is characterized in that the field effect transistor is LDD-type in which the drain region is provided with a lightly doped region with a length which is determined by a spacer arranged on the side wall of the insulated gate electrode.

These and other aspects of the invention will be apparent from and elucidated with reference to the embodiments described hereinafter.

DESCRIPTION OF THE PREFERRED EMBODIMENTS

Figure 1:
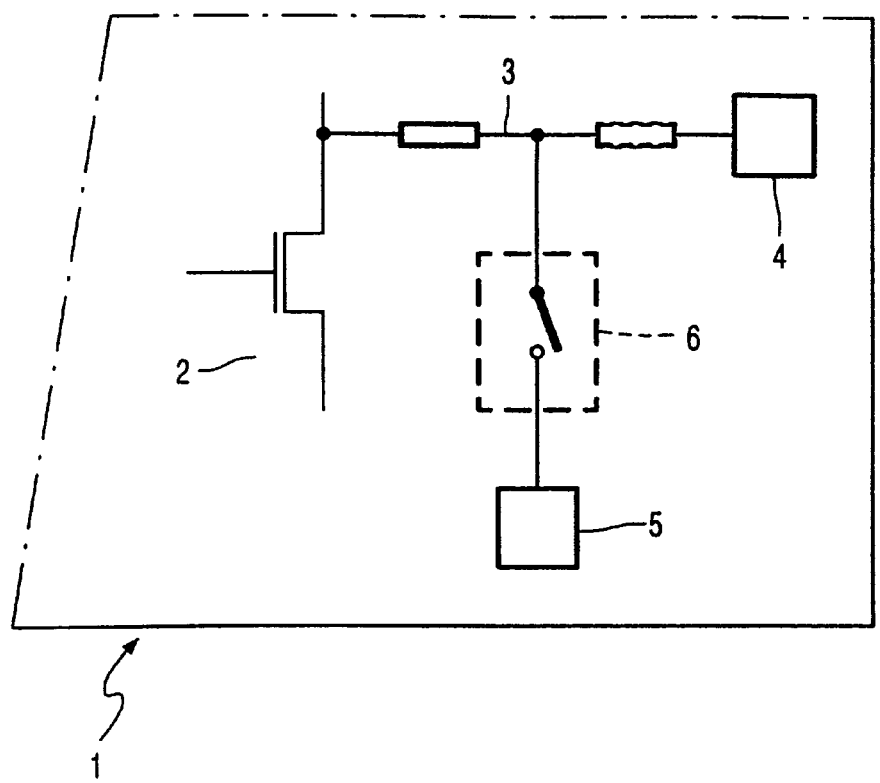
FIG. 1 is a plan view of a part of a semiconductor device having an ESD-protection at the output of the circuit.

To elucidate the invention, in FIG. 1, the principle of ESD-protection at the output of an integrated circuit is shown. The drawing shows a part of a circuit 1 including an output transistor 2 whose drain region or drain is connected to an output terminal 3. Along the edge of the chip, bonding pads are arranged via which the circuit can be connected, by means of wires not shown in the drawing, to external supply conductors, for example the pins of the customary envelope. In the drawing, only two of these pads are shown, namely pad 4 which is connected to the output terminal 3, and pad 5 which, for example, is connected to earth.

In the drawing, the ESD-protection is schematically represented by the switch 6. If as a result of, for example, contact between a human body and the pin connected to the bonding pad 4 there is a risk of electrostatic discharge, the switch 6 is closed before the transistor is damaged, so that the electric charge (at least in the case of a positive voltage on the bonding pad 4) can be led away to earth via the switch 6 and the bonding pad 5. For the switch 6, use is made of the pn-junction of the drain region of transistor 2. On the assumption that the transistor 2 is an n-channel transistor in which the drain is formed by an n-type region in the semiconductor body surrounded by a p-type surface area, the pn-junction is reverse-biased in the case of a positive pulse on the bonding pad 4. If the reverse voltage is higher than the breakdown voltage, the diode breaks down. A part of the charge on the bonding pad 4 can be removed via the diode, another part may customarily be removed via the lateral bipolar npn-transistor formed by the n-type drain (collector), the p-type surface area (base) and the n-type source of transistor 2 (emitter) by means of the so-called snap-back effect.

Figure 2:
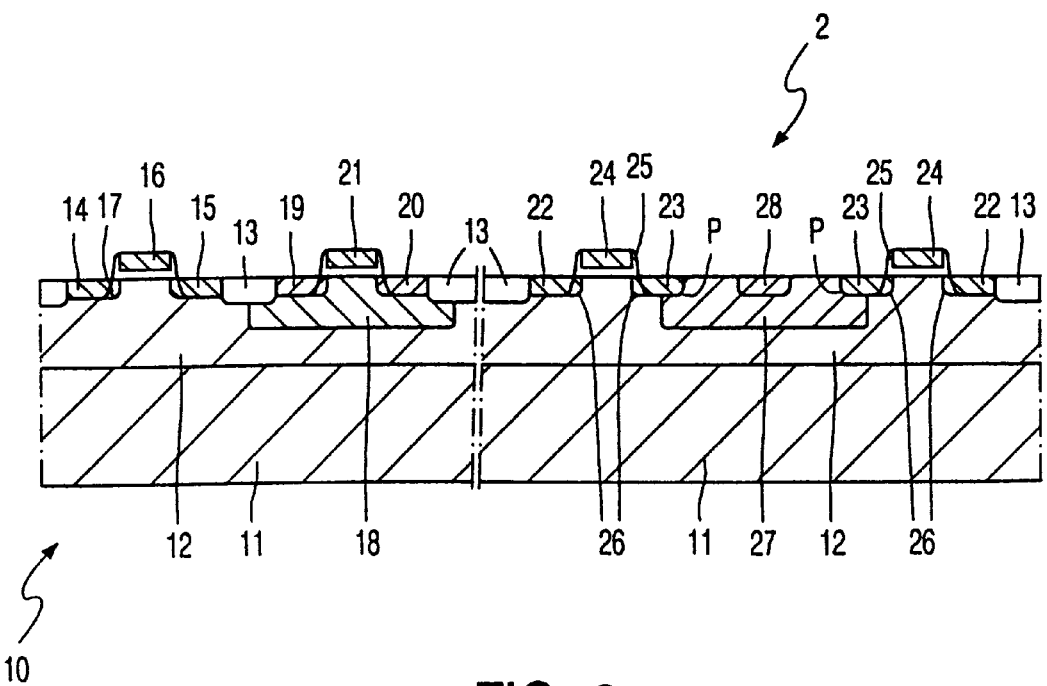
FIG. 2 is a sectional view of a first embodiment of an integrated circuit in accordance with the invention.

FIG. 2 is a schematic, sectional view of a first embodiment of a device in accordance with the invention, which can be manufactured by means of a standard CMOS process. The circuit comprises a semiconductor body 10 of silicon having a relatively low-ohmic p-type substrate 11 and, provided thereon, a relatively high-ohmic p-type epitaxial silicon layer 12. In the left part of FIG. 2, an n-channel and a p-channel MOS transistor are shown; the output transistor 2 is shown in the right part of the drawing. The active regions in which the switching elements are provided are defined by a field oxide pattern 13, which in the drawing is completely recessed in the semiconductor body 10, but which may alternatively project partly beyond the surface. The n-channel transistors of the CMOS pairs, only a single pair of which is shown in the drawing, are LDD-type (Lightly Doped Drain) and comprise a heavily doped n-type source and drain region 14 and 15, respectively, provided in the p-type epitaxial layer 12 and a doped poly gate 16 situated between the regions. The regions 14, 15 are separated from the channel in the customary manner by lightly doped n-type extensions 17, defined by the oxide spacers on the side wall of the gate 16. The p-channel transistor is formed in an n-type well 18 and includes a p-type source region 19, a p-type drain region 20 and a poly gate 21. The source and drain regions are provided with lightly doped p-type extensions.

The output transistor 2 is LDD n-channel type and comprises n-type source and drain regions 22 and 23, respectively, which are provided in the p-type surface area formed by the epi layer 12. The transistor further includes a poly gate 24 whose side walls are covered with an oxide spacer 25 which determines the length of the lightly doped n-type source/drain extensions 26. In addition, the surface area 12 is provided with a p-type well 27 with a doping concentration of approximately $10^{17}$ atoms per $cm^3$, which is substantially higher than that of the epi layer 12. If necessary, a heavily doped p-type contact region 28 may be provided in the well. The well extends from the surface to a greater depth than the drain region 23 in the surface area 12, is situated at a distance from the channel region between the source and drain regions, and extends below only a part of the drain region 23, so that the drain is situated in the well on the side facing away from the channel and in the epi layer 12 on the side bordering on the channel. Electric breakdown at point P, where the breakdown voltage is lowest, is caused by this construction, by the curvature of the pn-junction and by the heavier doping of the well 27. By virtue thereof, breakdown at the surface is avoided, which in known circuits, often causes an increase of the leakage currents and/or necessitates an additional resistance in the current path of the drain. Since, in the device in accordance with the invention, breakdown occurs in the bulk of the silicon, at a distance from the surface, the properties of the pn-junction upon breakdown are changed hardly or not at all. Additional resistors, which must ensure a uniform current distribution, are superfluous so that the transistor does not have to be increased in size. Moreover, the additional advantage of a lower "ground bounce" can be achieved. At a doping concentration of approximately $10^{17}$ atoms per $cm^3$ in the well (at least at the location of P) a breakdown of approximately 10 V was achieved in a practical embodiment. The breakdown voltage without the p-well is approximately 13 V and is found to be associated in general with breakdown at the surface.

Figure 3:
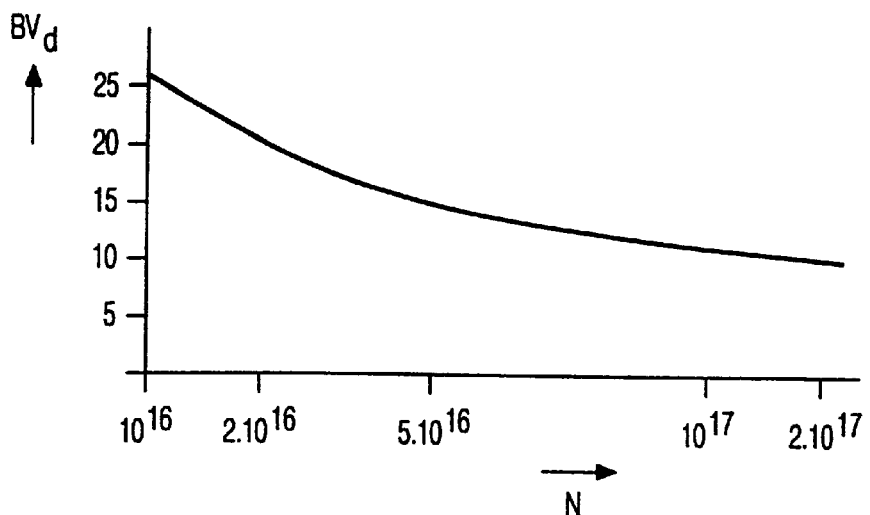
FIG. 3 shows the connection between the bulk-breakdown voltage and the doping concentration in the well.

FIG. 3 shows the connection between the bulk breakdown voltage BVd (vertical axis) and the doping N in the well 27 (horizontal axis). At lower concentrations, the bulk breakdown voltage is higher than 13 V. At a concentration of the order of $10^{17}$ atoms per $cm^3$, bulk breakdown occurs sooner than surface breakdown, and usable values of 10 V are attained.

Figure 4:
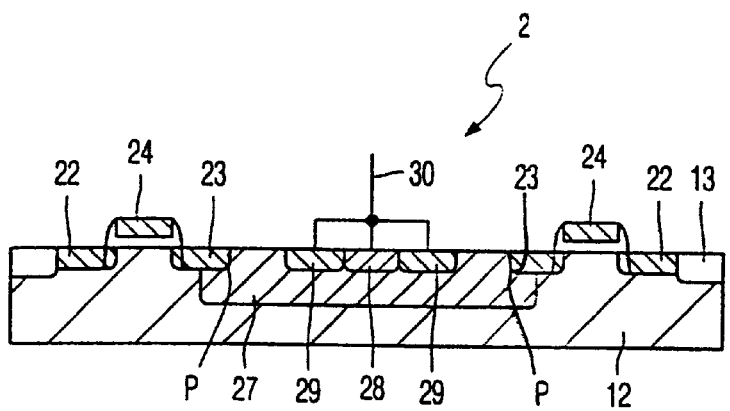
FIG. 4 is a sectional view of a second embodiment of a semiconductor device in accordance with the invention.
Figure 5:
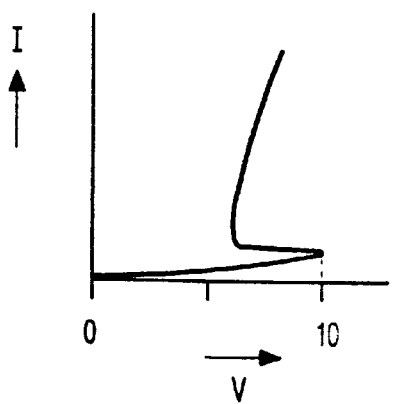
FIG. 5 shows a current-voltage diagram of this ESD-protection.

In the case of breakdown, not only electrons but also holes are generated in the silicon material. If sufficiently large quantities of holes flow to the source region 22, the snap-back effect may cause the lateral npn transistor, comprising the emitter 22, the base 12 and the collector 23 to become conducting, so that a particularly low-ohmic charge dissipation to earth is formed. Without the "snap-back" effect, the ESD-protection described herein is entirely based on the diode characteristic. FIG. 4 shows an embodiment of the output transistor with an enhanced snap-back effect. FIG. 4 only shows the output transistor 2 with ESD-protection of the integrated circuit; for the CMOS transistors of the circuit, reference is made to FIG. 2. Also the transistor shown in FIG. 4 is provided in the high-ohmic p-type epi layer 12 and includes n-type source and drain regions 22 and 23, respectively, provided with high-ohmic n-type extensions defined by spacers on the walls of the poly gate 24. The epi layer 12 is locally more heavily doped by p-type well 27 which extends below and halfway the drain 23. For the doping of the well 27, the same value as in the preceding example is taken, so that breakdown occurs again at point P at a distance from the surface. On either side of the p-type contact region 28 in the well, heavily-doped n-type regions 29 are also provided in the well 27 and at a relatively small distance from the drain regions 23. In this example, the regions 29 are conductively connected, via the schematically shown contact 30, to the p-type regions 12 and 27 but they may of course also be connected to another suitable point of the circuit. In the case of breakdown, the holes formed flow to the p-type region 28, so that a voltage is built up in the well and the lateral bipolar npn transistor (29, 12, 23) becomes conducting, as a result of which the resistance of the element is reduced and the I-V characteristic shown in FIG. 5 is obtained.

Figure 6:
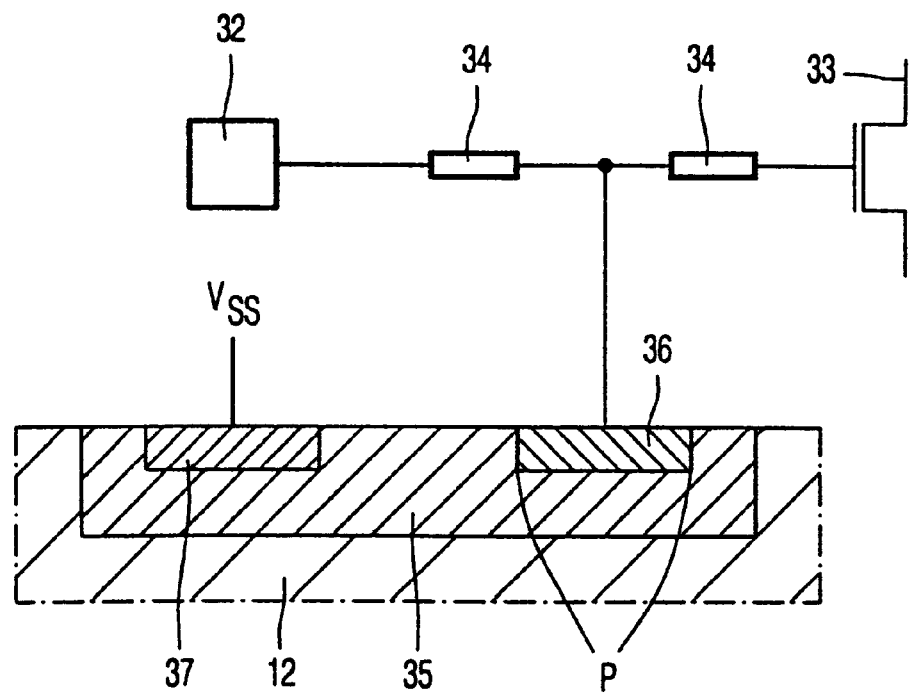
FIG. 6 is a sectional view of an ESD-protection at the input, which can be used in a semiconductor device in accordance with the invention.
Figure 7:
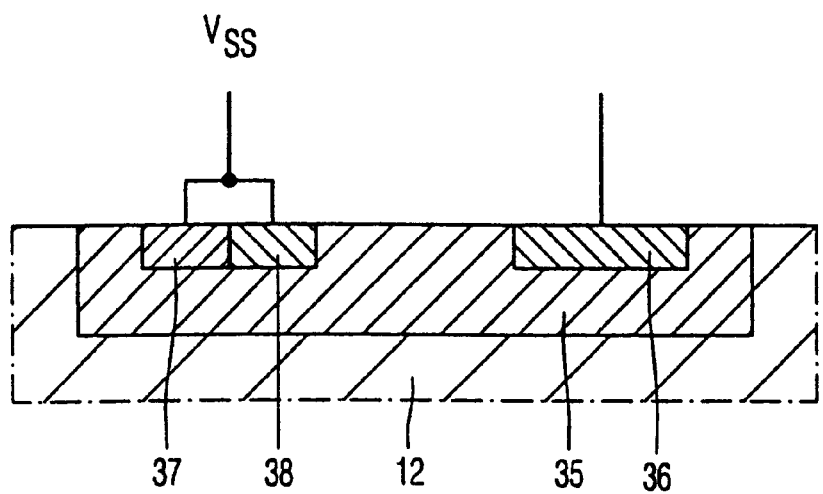
FIG. 7 shows a variant of this input(supply) protection.

In these examples, ESD-protections are described which are coupled to the output transistor. It will be obvious that such a transistor can also be used as an ESD-protection at the input of the circuit, in which case the gate 24 may be connected, for example, to earth or $V_{ss}$. FIG. 6 is a sectional view of a simpler embodiment of a protection diode which, in combination with one of the above-described elements, can be used as a protection at the input or at the supply of the circuit. In the drawing, an input bonding pad 32 is shown which is connected to the input (gate) of a transistor 33. The resistance of the wiring is represented by the resistors 34. The protection diode is arranged in a p-type well 35 having the same doping as the well 27 in the preceding examples and comprising a heavily doped n-type cathode 36 and a p-type anode 37. The cathode is connected to the bonding pad 32, the anode to a low reference voltage, for example $V_{ss}$. Also in this diode, a high voltage on the bonding pad 32 causes breakdown at the curvature near P in the bulk of the crystal and not at the surface, so that the properties of the breakdown diode change hardly or not at all as a result of said breakdown. In this embodiment, for the removal of charge, use is made of the diode characteristic in. FIG. 7 shows a variant of the embodiment shown in FIG. 6, in which the above-described snap-back effect can again be advantageously used.

In FIG. 7, the parts which correspond to parts in FIG. 6 are denoted by the same reference numerals. The embodiment shown in FIG. 7 differs from that shown in FIG. 6 in that between the cathode 36 and the anode 37 a heavily doped n-type region 38 is provided in the well 35, which, in this example, just like anode 37 is connected to $V_{ss}$. This region forms the emitter of a lateral bipolar transistor with region 35 as the collector and the well as the base. In the case of breakdown at the cathode, this transistor may become conducting, so that a I-V characteristic as shown in FIG. 5 is obtained.

It will be obvious that the invention is not limited to the above-described examples, and that within the scope of the invention many variations are possible to those skilled in the art. For example, in the above-described examples, the conductivity types may be reversed.

What is claimed is:

1. A semiconductor device comprising a semiconductor body including an integrated circuit provided with bonding pads for connecting the circuit to external supply conductors and with means for protecting the circuit against damage caused by electrostatic discharge, said means comprising at least a protection diode which is connected to a bonding pad and formed by a drain region of a field effect transistor with an insulated gate electrode, which field effect transistor includes a source region and a drain region, which are separated from each other by an intermediate channel region, said source and drain regions being formed by surface regions of a first conductivity type in a surface region of a second, opposite, conductivity type, wherein a well of the second conductivity type having a surface and a higher doping than that of the surface region is provided in said surface region of the second conductivity type, which well extends from the surface to a greater depth in the semiconductor body than that of the drain region and is spaced apart from the channel region and extends only below a part of the drain region, said drain region being situated, on a side facing away from the channel region, in the well and, on a side bordering on the channel region, in the surface region of the second conductivity type.

2. A semiconductor device as claimed in claim 1, characterized in that the source region and the channel region are both situated in the surface region of the second conductivity type.

3. A semiconductor device as claimed in claim 2, characterized in that the well is of the second conductivity type and provided with a surface area of the first conductivity type which is situated at a distance from the drain region of the first conductivity type and which forms the emitter of a lateral bipolar transistor whose base region and collector region are formed, respectively, by the well of the second conductivity type and the drain region of the first conductivity type.

4. A semiconductor device as claimed in claim 3, characterized in that the well is provided with a heavily doped contact region of the second conductivity type which is conductively connected to the emitter zone of the first conductivity type, said emitter zone, viewed on the surface, being situated between the collector region and the contact region of the well.

5. A semiconductor device as claimed in claim 4, characterized in that the doping concentration of the surface region of the second conductivity type is approximately $10^{16}$ atoms per cm$^3$, and the doping concentration of the well, at least at a depth corresponding to the thickness of the drain region, is of the order of $10^{17}$ atoms per cm$^3$.

6. A semiconductor device as claimed in claim 5, characterized in that the field effect transistor is LDD-type, in which the drain region is provided with a lightly doped region whose length is determined by a spacer provided on the side wall of the insulated gate electrode.

7. A semiconductor device as claimed in claim 6, characterized in that the field effect transistor forms an output transistor of the integrated circuit.

8. A semiconductor device as claimed in claim 6, characterized in that the field effect transistor forms an output transistor of the integrated circuit.

9. A semiconductor device as claimed in claim 1, characterized in that the doping concentration of the surface region of the second conductivity type is approximately $10^{16}$ atoms per cm$^3$, and the doping concentration of the well, at least at a depth corresponding to the thickness of the drain region, is of the order of $10^{17}$ atoms per cm$^3$.

10. A semiconductor device as claimed in claim 1, characterized in that the field effect transistor is LDD-type, in which the drain region is provided with a lightly doped region whose length is determined by a spacer provided on the side wall of the insulated gate electrode.

11. A semiconductor device as claimed in claim 1, characterized in that the well is of the second conductivity type and provided with a surface area of the first conductivity type which is situated at a distance from the drain region of the first conductivity type and which forms the emitter of a lateral bipolar transistor whose base region and collector region are formed, respectively, by the well of the second conductivity type and the drain region of the first conductivity type.

12. A semiconductor device as claimed in claim 11, characterized in that the well is provided with a heavily doped contact region of the second conductivity type which is conductively connected to the emitter zone of the first conductivity type, said emitter zone, viewed on the surface, being situated between the collector region and the contact region of the well.

13. A semiconductor device as claimed in claim 11, characterized in that the doping concentration of the surface area is approximately $10^{16}$ atoms per $cm^3$, and the doping concentration of the well, at least at a depth corresponding to the thickness of the drain region, is of the order of $10^{17}$ atoms per $cm^3$.

14. A semiconductor device as claimed in claim 11, characterized in that the field effect transistor is LDD-type, in which the drain region is provided with a lightly doped region whose length is determined by a spacer provided on the side wall of the insulated gate electrode.

15. A semiconductor device as claimed in claim 11, characterized in that the field effect transistor forms an output transistor of the integrated circuit.

* * * * *